United States Patent [19]

Derks et al.

[11] Patent Number: 4,460,619
[45] Date of Patent: Jul. 17, 1984

[54] METHOD FOR TRANSPORTING AND DEPOSITING VISCOUS MATERIALS

[75] Inventors: Pierre L. L. M. Derks; Gerardus Van Herwijnen, both of Eindhoven, Netherlands

[73] Assignee: U.S. Philips Corporation, New York, N.Y.

[21] Appl. No.: 497,465

[22] Filed: May 23, 1983

[30] Foreign Application Priority Data

May 27, 1982 [NL] Netherlands ......................... 8202164

[51] Int. Cl.³ .............................................. B05D 3/12
[52] U.S. Cl. .................................................... 427/57
[58] Field of Search ........................................... 427/57

Primary Examiner—Bernard D. Pianalto
Attorney, Agent, or Firm—Jack E. Haken; James J. Cannon, Jr.

[57] ABSTRACT

A method and apparatus for transporting small quantities of viscous material and for depositing the viscous material on a substrate by means of a transport pin formed by an ultrasonic sonotrode. Two components of a two-component adhesive may be supplied in small metered quantities and intimately mixed and the mixture may be deposited on a substrate. Due to the fact that the two components are mixed only a short time before they are deposited on the substrate, the pot life of the mixture does not become a problem.

5 Claims, 9 Drawing Figures

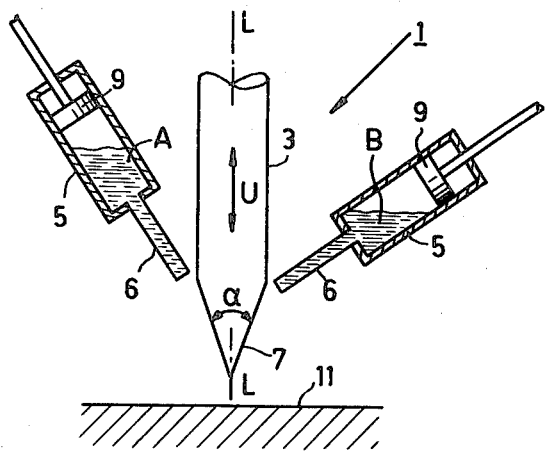 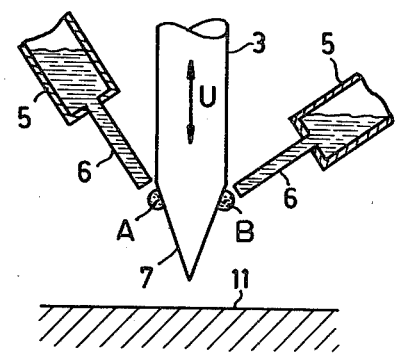
FIG.1  FIG.2
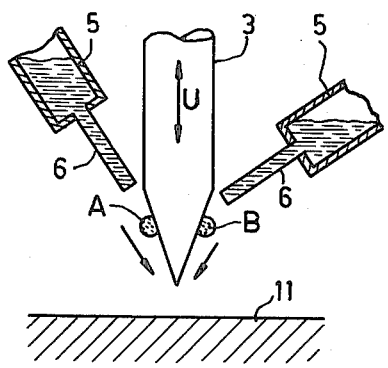 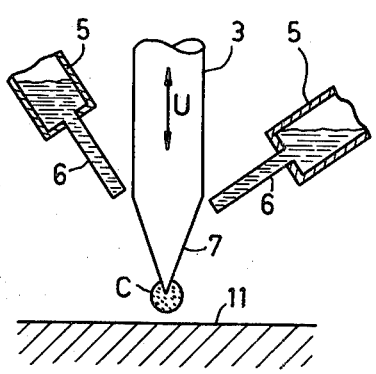
FIG.3  FIG.4
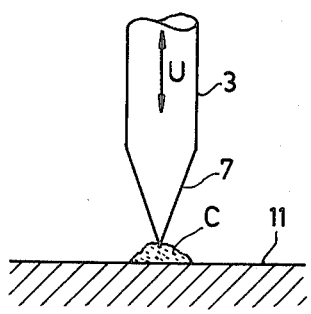 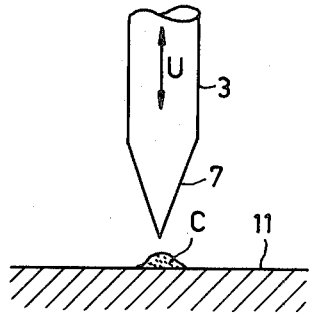
FIG.5  FIG.6

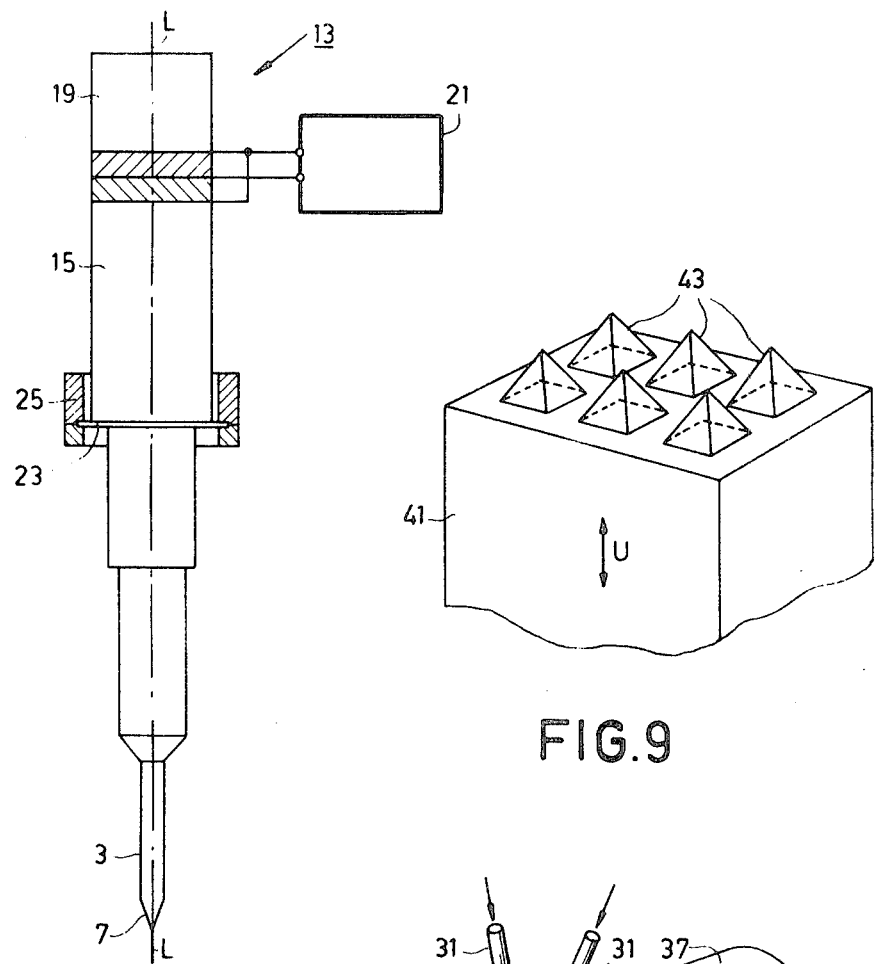
FIG.7
FIG.9
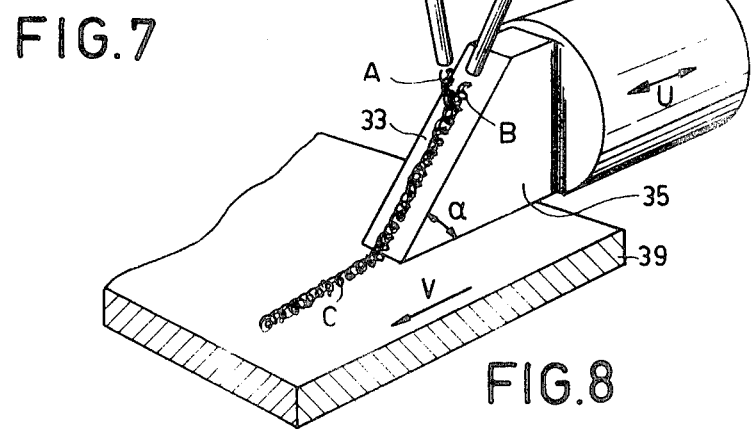
FIG.8

METHOD FOR TRANSPORTING AND DEPOSITING VISCOUS MATERIALS

BACKGROUND OF THE INVENTION

1. Field of the Invention

The invention relates to a method of transporting and depositing viscous materials, in which a quantity of a viscous material to be transported and deposited is supplied by means of a vibrating tool to a substrate and is deposited on the substrate.

2. Description of the Prior Art

Such a method is known from U.S. Pat. No. 4,145,390. In this known method, the vibrations of the tool lie in a frequency range between 1 Hz and 10 kHz; the amplitude of the vibrations is of the order of 0.5 mm.

SUMMARY OF THE INVENTION

The invention has for its object to provide a method of the kind mentioned in the opening paragraph which renders it possible to transport very small metered quantities of viscous materials and to deposit them in an accurately defined position on the substrate. The term "very small quantities" is to be understood to mean quantities of the order of a few mg or of a few mm$^3$.

According to the invention, this is achieved by applying at least one viscous material in a metered quantity to the sonotrode of an ultrasonic tool and vibrating the sonotrode ultrasonically in such a manner that the quantity of viscous material is transported under the influence of the ultrasonic vibrations along the sonotrode to a free end thereof in a direction which is at an acute angle to the direction of vibration of the sonotrode, the quantity of viscous material being ultimately deposited on the substrate from the free end of the sonotrode.

The invention is based on the discovery that by vibrating a tool ultrasonically a small quantity of a viscous material can be displaced over the surface of the tool in a direction which is at an acute angle, that is to say, an angle less than 90°, to the direction of vibration of the tool. The accurately metered quantity of viscous material is applied to the sonotrode at a readily accessible area at a certain distance from the free end of the sonotrode. The whole of this quantity is transported to the end of the sonotrode and is ultimately deposited on the substrate without any filaments being formed and substantially without a noticeable or disturbing quantity of residual material being left on the sonotrode. It is possible that a thin film of the material may be left, but a concentration, a build-up or a cumulation of residual material does not occur. The term "ultrasonic vibrations" is to be understood herein to mean vibrations above the audible frequency range, i.e., in a frequency range of about 16 kHz to about 100 kHz, and having an amplitude of from 1 $\mu$m to 50 $\mu$m, the amplitude being defined as the maximum deflection of the sonotrode from the rest position. At a frequency below 16 kHz, a dangerously high acoustic radiation occurs; a frequency above 100 kHz is of no practical interest because of the necessarily very small dimensions of the tools and because of the low acceptable powers. The limit of the amplitude of 50 $\mu$m is determined in practice by the acceptable material stress to which the sonotrode may be subjected; the lower limit of 1 $\mu$m is determined by a necessary practical minimum. Below this minimum amplitude the desired effects are not achieved. The said extreme values of frequency and amplitude are dependent inter alia upon the shape of the sonotrode and upon the viscosity of the material to be processed. In general, at higher frequencies smaller vibration amplitudes are sufficient.

The term "viscous material" is to be understood to mean a material having a viscosity such that the desired effects can be achieved. Materials which have a tendency to atomize or to lose their cohesion at the said frequencies and amplitudes do not behave with the desired effect. Materials having a very high viscosity will not behave with either the desired transport or mixing effect. The viscosity of a given material can be favorably influenced by temperature variation. Examples of suitable viscous materials are: fats, oils, lacquers and paints and the constituents thereof, various glues and adhesives and their constituents, if necessary with additions in the form of metal particles and the like. The substrate on which the viscous material is deposited may be a printed circuit board on which spots of glue are to be deposited for fixing electronic elements, or it may be the elements themselves or one of two mechanical elements which may be made of metal and are to be glued together, or the like.

The method according to the invention moreover has the practically very important advantage that the transport is independent of the direction and the force of gravity, that is to say, the viscous material can be transported in any arbitrary direction, horizontally and even vertically upwards. This is possible because acceleration forces to which the viscous material is subjected as a result of the ultrasonic vibrations, are much higher than the influence of gravity.

The viscous material may, for example, be supplied to the sonotrode in a continuous metered flow and deposited on the substrate as a uniform bead. However, the invention is particularly suitable for processing small accurately metered quantities of viscous material. For this purpose, a preferred embodiment of the method according to the invention is characterized in that the metered quantity of viscous material is applied to the sonotrode in the form of a metered portion and is deposited on the substrate in the form of a drop.

In one embodiment of the method according to the invention the viscous material is deposited on the substrate in a simple and efficacious manner by increasing the amplitude of the ultrasonic vibrations so that the drop spontaneously becomes detached from the sonotrode. The amplitude required for the transport of the material is chosen for conformity with the viscosity and quantity of the viscous material. It has been found that by increasing this amplitude by about 50% the desired effect is attained, i.e. a spontaneous detachment of the drop which then falls freely onto the substrate.

In another embodiment of the method according to the invention the viscous material is deposited on the substrate by bringing the drop into contact with the substrate, after which the ultrasonically vibrating sonotrode and the substrate are moved away from each other, the drop being left on the substrate. This method is particularly suitable for quantities of viscous material of the order of 1 mg or 1 mm$^3$ and smaller because drops of such a small volume or weight do not become detached from the sonotrode under all conditions by merely increasing the amplitude.

A further embodiment of the method according to the invention is characterized in that at least one further viscous material is applied in a metered quantity to the sonotrode simultaneously with the application of the metered quantity of the first-mentioned viscous material, after which the metered quantities of the two materials are intimately mixed with each other under the influence of the ultrasonic vibrations and are deposited on the substrate only after they have been mixed.

This embodiment of the method according to the invention is of great practical importance in the processing and the use of two-component adhesives. If the components of such an adhesive have properties such that the curing time is short, the pot life of the adhesive after mixing of the components will also be short. By the same token, a longer pot life is generally associated with a comparatively long-curing time. With the present method these disadvantages are eliminated and two-component adhesives having an extremely short pot life can be used due to the fact that the adhesive components remain separated until an instant shortly before their deposition on the substrate and they are mixed with each other only at the free end of the sonotrode or at the earliest during their transport along the sonotrode. The problem of limited pot life no longer occurs; the pot life is almost unlimited. An optimum composition of the components can now be chosen for a curing time as short as possible. Of course, more than two components can also be mixed by means of this method; for example, three or more lacquer components can be mixed. Furthermore other components can be mixed with the method according to the invention, for instance the consituents for the manufacture of foams.

It should be noted that British Patent Specification No. 1,556,158 discloses a method and apparatus for activating polyurethane foam or another form of synthetic resin. In this case the components are mixed by means of a metal blade which is vibrated at ultrasonic frequency. However, the components to be mixed are supplied in comparatively large flows and under high pressure, the metal blade being vibrated under the influence of the pressure of the components. This known method, in contrast to the method according to the invention, is not suitable, for mixing the components of a foam of synthetic resin in small quantities of the order of a few mm$^3$ or a few mg.

The present invention also relates to an apparatus for carrying out the method of the present invention which apparatus comprises at least one vibratory tool serving as a transport member.

According to the invention, this apparatus is characterized in that the vibrating tool comprises a sonotrode which forms part of an ultrasonic vibration device and which comprises at least one transport pin having a cross-section which decreases gradually towards the free end of the pin and having at least one transport surface which is inclined relative to the direction of vibration of the sonotrode, the apparatus being further being characterized in that it comprises at least one metering device. The transport pin may be constructed in any of a large variety of forms, for example, in the form of a wedge which is asymmetrical with respect to the direction of vibration of the sonotrode, in which case one inclined surface of the pin serves as the transport surface for transporting one or more viscous materials. The transport pin may alternatively have the form of a symmetrical double wedge, in which case two inclined surfaces of the pin can act as transport surfaces for transporting two separate viscous materials.

A preferred embodiment of the apparatus in accordance with the invention which is suitable both for processing one or two viscous materials and for processing three or even four of these mateials is characterized in that the transport pin has the form of a cone or a pyramid.

The apical angle of the transport pin may have a value between 0° and 180°. With an apical angle of 180°, mixing occurs but transport does not occur; with an apical angle of 0°, neither transport in the desired direction nor mixing occurs.

One embodiment of the apparatus in accordance with the invention is characterized in that the sonotrode comprises several transport pins. With this embodiment, small quantities of the same material or the same component of a material can be deposited at several areas simultaneously. Thus, for example, a number of electrical parts which are delivered so as to be arranged in one row may be provided simultaneously on their lower sides with a first adhesive component by means of one sonotrode, while on the substrate on which the parts are placed the second adhesive component may be applied with the aid of another similar sonotrode.

Another embodiment of the apparatus in accordance with the invention is characterized in that the ultrasonic vibration device further comprises in a manner known per se a generator, a transducer and an amplitude transformer.

In view of the requirements imposed on the sonotrode, only a limited number of materials may be used for the manufacture of the sonotrode, especially materials with low damping losses for vibrations and with a high fatigue limit, such as aluminium alloys. However, aluminium is susceptible to cavitation and erosion when used for a long time. In a further embodiment of the device according to the invention, this disadvantage is obviated by making the sonotrode of a titanium alloy. A titanium alloy is an alloy mainly consisting of titanium and comprising aluminium, chromium and vanadium in quantities of percent by weight.

BRIEF DESCRIPTION OF THE DRAWINGS

The invention will be described more fully with reference to the drawings. In the drawings:

FIG. 1 shows diagrammatically an apparatus in accordance with the invention;

FIGS. 2 to 6 show the apparatus of FIG. 1 in different successive stages of carrying out the method according to the invention;

FIG. 7 shows the construction of an ultrasonic vibration device for use in apparatus according to the invention;

FIG. 8 shows diagrammatically an apparatus according to the invention for continuously mixing and depositing two viscous materials;

FIG. 9 shows a possible embodiment of a sonotrode for the multiple deposition of a viscous material.

DESCRIPTION OF THE PREFERRED EMBODIMENTS

FIG. 1 shows diagrammatically an apparatus 1 comprising a sonotrode 3, which forms part of an ultrasonic vibration device (not further shown). The apparatus further comprises two metering pumps 5 each provided with a canula 6. Reference numeral 7 denotes the conical tip of the sonotrode, which tip serves as a transport pin and has an apical angle $\alpha$. The metering pumps 5 are each provided with a piston 9 and each contain a viscous material, for example, the components A and B, respectively, of a two-component adhesive. Reference numeral 11 denotes a substrate on which a metered quantity of the two-component adhesive has to be deposited. The sonotrode 3 can be vibrated ultrasonically in the direction of the double arrow U, the vibration having an amplitude of from 1 μm to 50 μm and a frequency of from 16 kHz to 100 kHz.

The operation of the apparatus in carrying out the method will be explained in successive stages with reference to FIGS. 2 to 6 inclusive.

As is shown diagrammatically in FIG. 2, a metered portion of the component A and a metered portion of the component B are applied by means of the pistons 9 through the canulae 6 from the metering pumps 5 to the upper part of transport pin 7 of the sonotrode 3. At this this stage or immediately after this stage, the sonotrode 3 is set in vibration in the direction of the arrow U parallel to the center line L—L of the sonotrode. Under the influence of the ultrasonic vibrations, the portions A and B are transported to the pointed free end of the conical transport pin 7, the direction of transport in each case forming with the direction of vibration an acute angle equal to half the apical angle α. This stage is shown in FIG. 3.

As shown in FIG. 4, the portions A and B arrive at the free end of the transport pin 7 to form a common drop C having substantially a spherical shape due to the high speeds of the vibrating sonotrode, the two components thereby being intimately mixed. The common drop C adheres through a minimum contact area to the pointed end of the transport pin 7, while the mixing of the two components continues. When, as shown in FIG. 5, the drop C is brought into contact with the substrate 11 by lowering the sonotrode 3, the substrate is locally wetted. When the still vibrating sonotrode 3 is withdrawn, the drop C is left on the substrate, as shown in FIG. 6.

According to an alternative embodiment of the method according to the invention, the drop C is deposited on the substrate 11 by abruptly increasingly the amplitude of the ultrasonic vibrations by about 50%, as a result of which the drop C becomes detached from the end of the transport pin 7 and falls freely onto the substrate 11. In this alternative method, the stage shown in FIG. 5 is dispensed with.

FIG. 7 shows an ultrasonic vibration device 13 comprising, in addition to the sonotrode 3 with the transport pin 7 already described, an amplitude transformer 15, a transducer 19 and a generator 21. Reference numeral 14 denotes two disk-like piezoelements. By means of a suspension flange 23, the apparatus is suspended in a suspension ring 25. The sonotrode 3 is preferably made of a titanium alloy. The line L—L indicates the center line of the sonotrode 3. In the embodiment shown, the transport pin 7 is integral with the sonotrode 3.

Experiments were carried out with the method and apparatus described above, using the following parameters: two drops of a two-component adhesive, each drop comprising 15 mg of the component A and of the component B, respectively, were mixed with each other in a ratio 1:1 by means of a sonotrode vibrated at a frequency of 40 kHz and with an amplitude of 30 μm. The transport and mixing time was 3 sec. The viscosity of the mixture was 3 Pa.s. The transport pin formed by the conical tip of the sonotrode had an apical angle of 40°.

FIG. 8 shows diagrammatically an embodiment for continuously mixing the two components of a two-component adhesive, which components are supplied through canulae 31 in two continuous flows A and B to the inclined transport surface 33 of an asymmetrical wedge-shaped transport pin 35 of a sonotrode 37. The two flows A and B of the two components are mixed on the vibrating transport surface 33 and are deposited on a substrate 39 in the form of a common bead C. In practical experiments with such an embodiment, parameters of the same order of magnitude as described above were used for continuously mixing and depositing a two-component adhesive. The length of the transport and mixing path on the transport surface 33 was 20 mm. In order to form the bead C on the substrate 39, the sonotrode and the substrate have to be displaced relative to one another at a uniform speed. In the embodiment shown, the substrate 39 is displaced for this purpose relative to the sonotrode 37 in the direction of the arrow V.

FIG. 9 shows diagrammatically a possible embodiment of a sonotrode 41 with a number of identical transport pins 43 for simultaneously depositing small quantities of the same viscous material. This material can either be applied to the transport pins by immersing the pins in a bath of the viscous material or the material can be supplied in metered quantities through canulae to the transport pins. Many modifications of the last-mentioned embodiment are possible. In FIG. 9 the transport pins 43 are shown as having a pyramidal form. The pins are preferably secured to the sonotrode so as to be interchangeable and may be arranged in various desired patterns.

What is claimed is:

1. A method of transporting and depositing viscous materials, in which a quantity of a viscous material to be transported and deposited is supplied by means of a vibrating tool to a substrate and is deposited on the substrate, comprising the steps of:

applying at least one viscous material in a metered quantity to the sonotrode of an ultrasonic tool; and vibrating the sonotrode ultrasonically in such a manner that the quantity of viscous material is transported under the influence of the ultrasonic vibrations along the sonotrode to a free end thereof in a direction which is at an acute angle to the direction of vibration of the sonotrode, the quantity of viscous material being ultimately deposited on the substrate from the free end of the sonotrode.

2. A method as claimed in claim 1, characterized in that the metered quantity of viscous material is applied in the form of a metered portion to the sonotrode and is deposited in the form of a drop on the substrate.

3. A method as claimed in claim 1 or 2, characterized in that the viscous material is deposited on the substrate by increasing the amplitude of the ultrasonic vibrations so that the drop becomes spontaneously detached from the sonotrode.

4. A method as claimed in claim 1 or 2, characterized in that the viscous material is deposited on the substrate by bringing the drop into contact with the substrate, after which the ultrasonically vibrating sonotrode and the substrate are moved away from each other, the drop being left on the substrate.

5. A method as claimed in claim 1 or 2, characterized in that at least one further viscous material is applied in a metered quantity to the sonotrode simultaneously with the application of the metered quantity of the first-mentioned viscous material, after which the metered quantities of the two materials are intimately mixed with each other under the influence of the ultrasonic vibrations and are deposited on the substrate only after they have been mixed.

* * * * *